(12) United States Patent
Tomishima

(10) Patent No.: US 7,466,615 B2
(45) Date of Patent: Dec. 16, 2008

(54) LOW VOLTAGE DATA PATH AND CURRENT SENSE AMPLIFIER

(75) Inventor: Shigeki Tomishima, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 345 days.

(21) Appl. No.: 11/358,089

(22) Filed: Feb. 21, 2006

(65) Prior Publication Data

US 2007/0177442 A1    Aug. 2, 2007

(30) Foreign Application Priority Data

Feb. 1, 2006    (JP)    ............................. 2006-024795

(51) Int. Cl.
G11C 7/02    (2006.01)
(52) U.S. Cl. .................. 365/207; 365/203; 365/189.16; 365/189.17
(58) Field of Classification Search ................ 365/207, 365/203, 189.16, 189.17
See application file for complete search history.

(56) References Cited

U.S. PATENT DOCUMENTS

| | | | |
|---|---|---|---|
| 6,944,066 B1 | 9/2005 | Jing | |
| 7,061,817 B2 * | 6/2006 | Raad et al. | 365/201 |
| 2005/0018511 A1 * | 1/2005 | Lee | 365/207 |

* cited by examiner

*Primary Examiner*—Pho M. Luu
*Assistant Examiner*—Toan Le
(74) *Attorney, Agent, or Firm*—Brooks Cameron & Huebsch PLLC

(57) ABSTRACT

Methods, circuits, devices, and systems are provided, including a low voltage data path and current sense amplifier. One data path includes a local input/output (LIO) line and a global input/output (GIO) line each having first and second signal lines. A source follower circuit, coupled between the LIO line and the GIO line, includes first and second n-channel MOS (NMOS) transistors having a drain coupled to the first and the second signal lines of the GIO and a gate coupled to the first and the second signal lines of the LIO. A third NMOS transistor has a source coupled to the source of the first and the second NMOS transistors, a gate coupled to a reference voltage supply and a drain coupled to a drain of a fourth NMOS transistor. The fourth NMOS has a gate to which a selection signal is applied and a source coupled to a ground.

28 Claims, 8 Drawing Sheets

LOW VOLTAGE DATA PATH AND CURRENT SENSE AMPLIFIER

CROSS-REFERENCE TO RELATED APPLICATIONS

The application claims priority to Japanese Patent Application No. 2006-24795, filed Feb. 1, 2006, which is incorporated herein by reference.

TECHNICAL FIELD

The invention relates generally to integrated circuit memory devices, and more particularly, to a data path in a memory device.

BACKGROUND OF THE INVENTION

As the processing speed of microprocessors increases, the demand for memory devices having faster access times also increases. Additionally, the demand for memory devices that are designed for low voltage operation has also increased with the popularity of portable computing devices, which are typically battery operated. Memory system designers have developed methods and designs that shave off nanoseconds from access times in order to satisfy the demand for high speed memory devices while operating under low voltage conditions. Even with the advances made in memory device designs, the fundamental building blocks of memory devices have remained relatively the same. As will be described in more detail below, these building blocks are the basic elements that are shared among all types of memory devices, regardless of whether they are synchronous or asynchronous, random-access or read-only, or static or dynamic.

FIG. 1 illustrates an example memory device 110. As shown in the example of FIG. 1. The memory device includes an address register 112 that receives either a row address or a column address on an address bus 114. The address bus 114 is generally coupled to a memory controller (not shown). A row address is initially received by the address register 112 and applied to a row address multiplexer 118. The row address multiplexer 118 couples the row address to a number of components associated with either of two memory bank arrays, e.g., 120 and 122, depending upon the state of a bank address bit forming part of the row address. The arrays 120 and 122 are comprised of memory cells arranged in rows and columns. Associated with each of the arrays 120 and 122 is a respective row address latch 126, which stores the row address, and a row decoder 128, which applies various signals to its respective array 120 or 122 as a function of the stored row address.

After the row address has been applied to the address register 112 and stored in one of the row address latches 126, a column address is applied to the address register 112. The address register 112 couples the column address to a column address latch 140. The column address latch 140 momentarily stores the column address while it is provided to the column address buffer 144. The column address buffer 144 applies a column address to a column decoder 148, which applies various column signals to respective sense amplifiers and associated column circuits 150 and 152 for the respective arrays 120 and 122.

Data to be read from one of the arrays 120 or 122 are coupled from the arrays 120 or 122, respectively, to a data bus 158 through the column circuit 150 or 152, respectively, and a read data path that includes a data output buffer 156. Data to be written to one of the arrays 120 or 122 are coupled from the data bus 158 through a write data path, including a data input buffer 160, to one of the column circuits 150 or 152 where they are transferred to one of the arrays 120 or 122, respectively.

The above-described operation of the memory device 110 is controlled by a command decoder 168 responsive to high level command signals received on a control bus 170. These high level command signals, which are typically generated by the memory controller, are a chip select signal CS*, a write enable signal WE*, a row address strobe signal RAS*, and a column address strobe signal CAS*, where the "*" designates the signal as active low. The command decoder 168 generates a sequence of command signals responsive to the high level command signals to carry out a function, e.g., a read or a write operation, designated by each of the high level command signals. These command signals, and the manner in which they accomplish their respective functions, will be appreciated by one of ordinary skill in the art. Further explanation is omitted so as not to obscure embodiments of the disclosure.

As mentioned above, read data are coupled from one of the arrays 120 and 122 to the data bus 158 through a read data path, explained in more detail in connection with FIG. 2.

FIG. 2 illustrates an example data path 200 for a memory device, such as memory device 110 shown in FIG. 1. The data path 200 is coupled through a column decoder 248 and sense amplifiers 212 to a memory cell array 220 that is arranged in rows and columns of memory cells. Only one memory cell array 220 is illustrated in order to reduce the complexity of the drawing. However, embodiments are not so limited and, as shown in FIG. 1, more than one memory array, or bank of memory arrays, may be coupled to a particular column decoder 248. The sense amplifiers 212 shown in FIG. 2 may be included in the sense amplifiers and associated column circuits illustrated at 150 and 152 in FIG. 1.

Each of the columns of memory cells of the memory cell array 220 is represented by a pair of digit lines, e.g., 211, coupled to a respective one of the sense amplifiers 212. As known in the art, when the memory cell array 220 is accessed, a row of memory cells (not shown) are activated, and the sense amplifiers 212 amplify data by coupling each of the digit lines of the selected column to voltage supplies such that the digit lines have a complementary logic levels. The column decoder 248 then selects one of the columns of memory cells to be coupled to a local input/output (LIO) line 216 of the data path 200 based on a column address. The LIO 216 is represented by a pair of signal lines, e.g., 217A and 217B, each of which is coupled to a respective one of the pair of digit lines 211 by the column decoder 248. At the time the selected column is coupled to the LIO 216, the signal lines 217A and 217B of the LIO 216 are precharged to an internal supply voltage VINT for the memory cell array 220 through p-channel MOS (PMOS) transistors 220 and 222. A section selection signal SEC activates n-channel MOS (NMOS) pass gates 230 and 232 to couple the LIO 216 to global input/output (GIO) line 240. The GIO 240 is represented by a pair of signal lines, e.g., 241A and 241B, which are coupled to a respective one of the pair of signal lines 217A and 217B of the LIO 216. PMOS transistors 244 and 246 couple the signal lines 241A and 241B of the GIO 240 to the VINT supply of the array 220 for precharging. As discussed in more detail below, since the data path 200 is based on current mode sensing, the signal lines of the LIO 216 and the GIO 240 are coupled to the VINT supply to prevent significant voltage variations of the LIO 216 and GIO 240 when data read from the memory cell array 220 is coupled to the LIO 216 and GIO 240.

A current sense amplifier 250 is coupled to the GIO 240 to sense a current difference between the signal lines 241A and 241B of the GIO 240 and generate voltage output signals CLAT and CLAT_ (CLAT "bar", also expressible as /CLAT or complementary latch) in response to the current difference. The output signals CLAT and CLAT_ have complementary logic levels, CLAT being the "true" logic level and CLAT_ being the "not true" logic level, as indicated by the underscore "_", "/", etc. The CLAT and CLAT_ signals are coupled to an output buffer to provide an output data signal at an external data terminal. The current sense amplifier 250 includes a pair of PMOS transistors 254, 256 for coupling respective signal lines of the GIO 240 to the VINT supply, and further includes a pair of cross coupled PMOS transistors 260, 264 and a pair of diode coupled NMOS transistors 270, 274 coupled to a drain of a respective PMOS transistor 260, 264. The CLAT and CLAT_ output signals are taken from output nodes 280, 284 corresponding to the drain of the PMOS transistors 260, 264. Coupled to the sources of the NMOS transistors 270, 274 is a NMOS selection transistor 280 for coupling the NMOS transistors 270, 274 to ground in response to an active selection signal SEL. It will be appreciated that FIG. 2 is provided by way of example, and other functional blocks have been omitted from the data path 200 to avoid overcomplicating the description of operating the data path 200.

In operation, when a memory cell is read, a selected pair of digit lines of a column of memory is coupled to the LIO 216 by the column decoder 248 and the pass-gates 230, 232 are activated to couple the LIO 216 to the GIO 240. A current difference is created in the pairs of signals lines in response to the data state of the memory cell being read. The current difference is detected by the current sense amplifier 250 by creating a current imbalance in the PMOS/diode coupled NMOS legs 260, 270 and 264, 274. The current imbalance results in a voltage difference at the respective output nodes 280, 284, which is further amplified as one of the cross coupled PMOS transistors 260, 264 becomes saturated and the other becomes cutoff. In this manner, the CLAT and CLAT_ signals achieve complementary logic levels.

The GIO lines 240 are physically long signal lines that are routed over the memory device to selectively couple, based on the selective activation of the SEC signal, physically shorter LIO lines 216 to a respective current sense amplifier 250. As a result, the GIO 240 have considerable line impedance that can significantly increase the time for sensing read data from the memory cell array 220 when voltage mode sensing is used. The current mode operation of the data path 200 has the advantage of avoiding the need to drive the signal lines of the GIO 240 to two voltage extremes as in the case for voltage mode sensing. Additionally, current mode operation allows for the voltage levels between the pairs of signal lines for the LIO 216, as well as the signal lines of the GIO 240, to be maintained at a relatively constant voltage. Thus, precharging and equilibrating time for the signal lines of the LIO 216, and of the GIO 240, can be shortened relative to memory devices employing voltage mode operation. As a result, access times can be shortened as well.

Current mode data paths, such as the data path 200, however, suffer when operated at low internal voltage levels. In order to operate properly, the data path 200 should have a VINT voltage level that is greater than the total voltage drop across the LIO 216, the GIO 240, and the PMOS/diode coupled NMOS legs 260, 270 or 264, 274. The voltage drop across the LIO 216 results from coupling a pair of digit lines to the respective signal lines of the LIO 216, and the voltage drop across the GIO 240 includes the voltage drop across the pass gates 230, 232, the precharge PMOS transistors 244, 246, and inherent line resistance of the typically lengthy signal lines of the GIO 240. The voltage drop across the PMOS/diode coupled NMOS legs 260, 270 or 264, 274, can be expressed as $(V_{tp}+V_{dpsat})+(V_{tn}+V_{dnsat})$, where $V_{tp}$ is the threshold voltage of the PMOS transistors 260, 264, $V_{dpsat}$ is the saturation voltage of the PMOS transistors 260, 264, $V_{tn}$ is the threshold voltage of the NMOS transistors 270, 274, and $V_{tnsat}$ is the saturation voltage of the NMOS transistors 270, 274.

When using typical operating currents and device characteristics for the data path 200, operation at a voltage level of 1.5 volts is satisfactory. However, where it is desirable to implement the data path 200 under operating conditions having voltage levels approaching 1.0 volts, the data path 200 may not consistently or accurately sense data read from the memory cell array 220. As a result, a read error occurs. Therefore, there is a need for a data path that can accurately and consistently sense read data under low voltage operating conditions.

SUMMARY OF THE INVENTION

Embodiments of the present invention include methods, circuits, devices, and systems including a low voltage data path and current sense amplifier. One data path includes a local input/output (LIO) line and a global input/output (GIO) line each having first and second signal lines. A source follower circuit, coupled between the LIO line and the GIO line, includes first and second n-channel MOS (NMOS) transistors having a drain coupled to the first and the second signal lines of the GIO and a gate coupled to the first and the second signal lines of the LIO. A third NMOS transistor has a source coupled to the source of the first and the second NMOS transistors, a gate coupled to a reference voltage supply and a drain coupled to a drain of a fourth NMOS transistor. The fourth NMOS has a gate to which a selection signal is applied and a source coupled to a ground.

In various embodiments the data path the data path includes a current sense amplifier coupled to the first and the second lines of the GIO. The current sense amplifier includes first and second load circuits, each load circuit having a first terminal coupled to a peripheral voltage supply and further having a second terminal. The current sense amplifier includes first and second NMOS transistors, each NMOS transistor having a drain terminal coupled to the second terminal of a respective load circuit and further coupled to an output buffer to provide complementary output voltage signals, a gate coupled to the drain of the other NMOS transistor, and a source coupled to the first and the second lines of the GIO. A precharge circuit is coupled to the source of the first and the second NMOS transistors.

An operational method embodiment for coupling data from a read/write circuit to an output buffer includes coupling a LIO line and a GIO line through a source follower circuit. According to the method, the first and second signal lines of LIO line are coupled to the read/write circuit and first and second signal lines of the GIO are coupled to a current sense amplifier such that a current flows from the current sense amplifier to the source follower circuit during a read operation. A current difference is sensed between the first and second signal lines of the GIO and an output voltage signal is generated based on the sensed current difference.

A method embodiment for fabrication of the low voltage data path includes forming a LIO line having first and second signal lines coupled to the read/write circuit. The fabrication method includes forming a GIO line having first and second signal lines coupled to a current sense amplifier and forming a source follower circuit to connect the first and second signal lines of the GIO to the first and second signal lines of the LIO,

DETAILED DESCRIPTION

Figure 2:
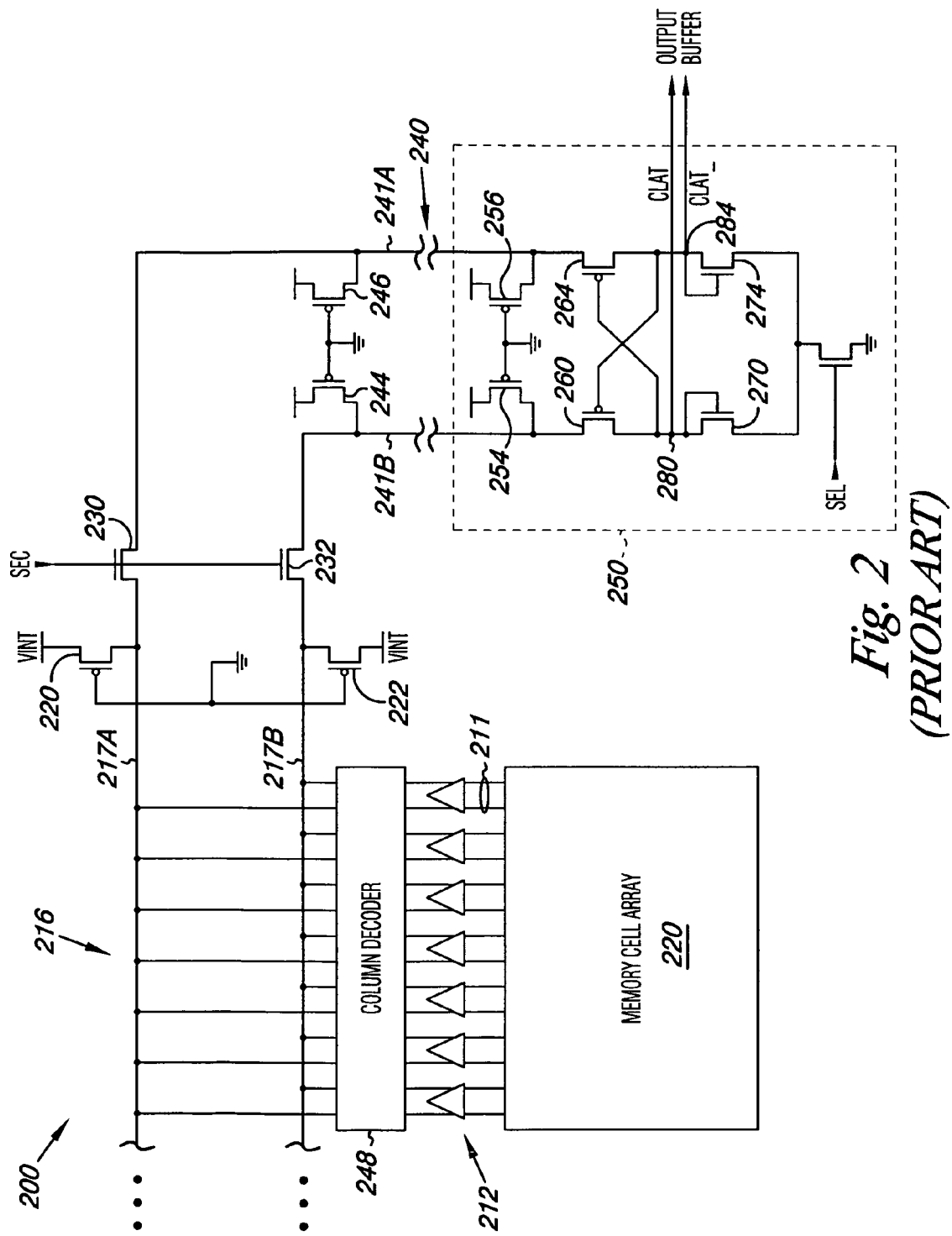
FIG. 2 illustrates an example data path for a memory device.
Figure 3A:
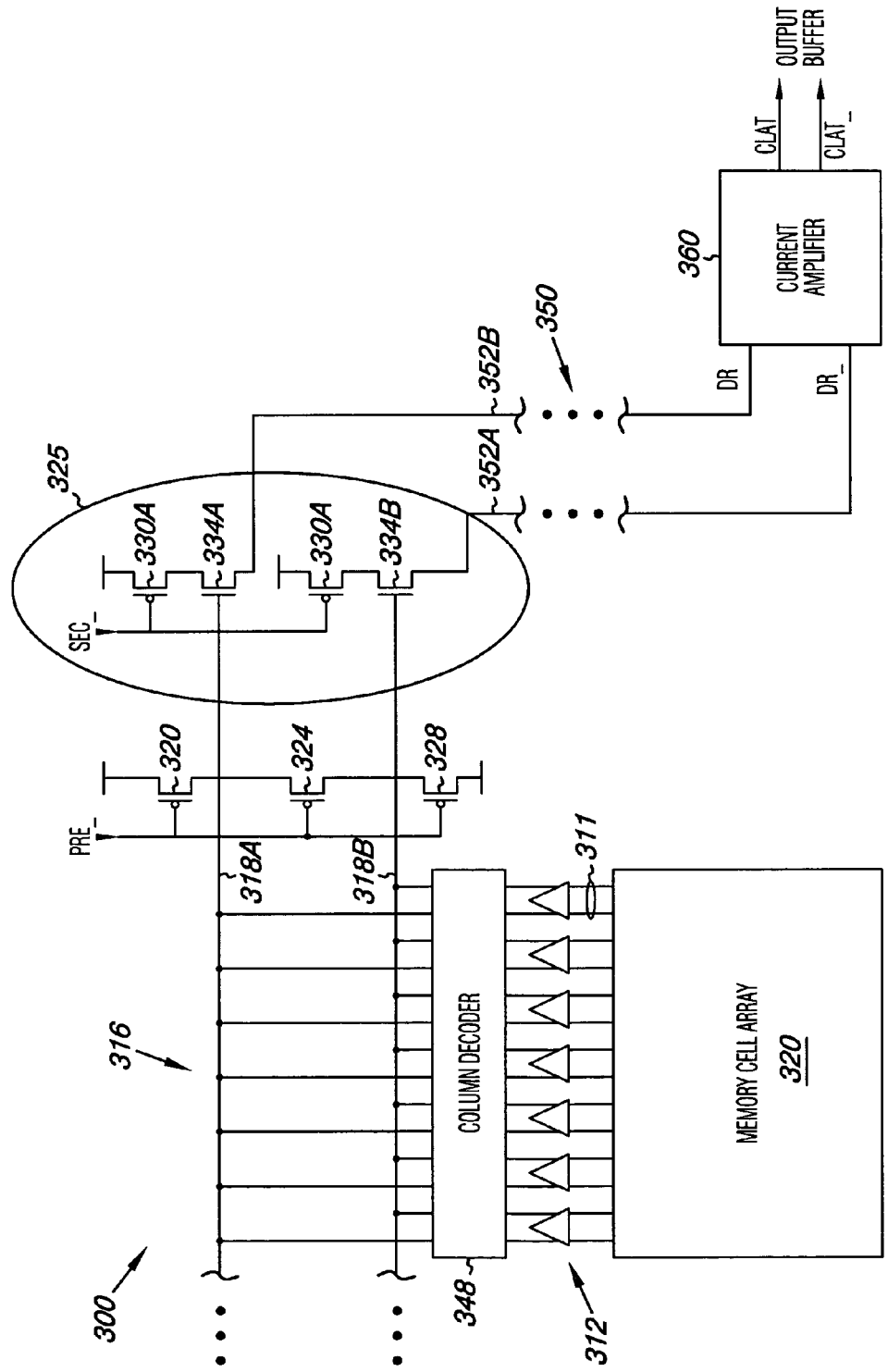
FIGS. 3A and 3B illustrate a different current sense scheme with a quasi-source follower circuit for a read operation.
Figure 3B:
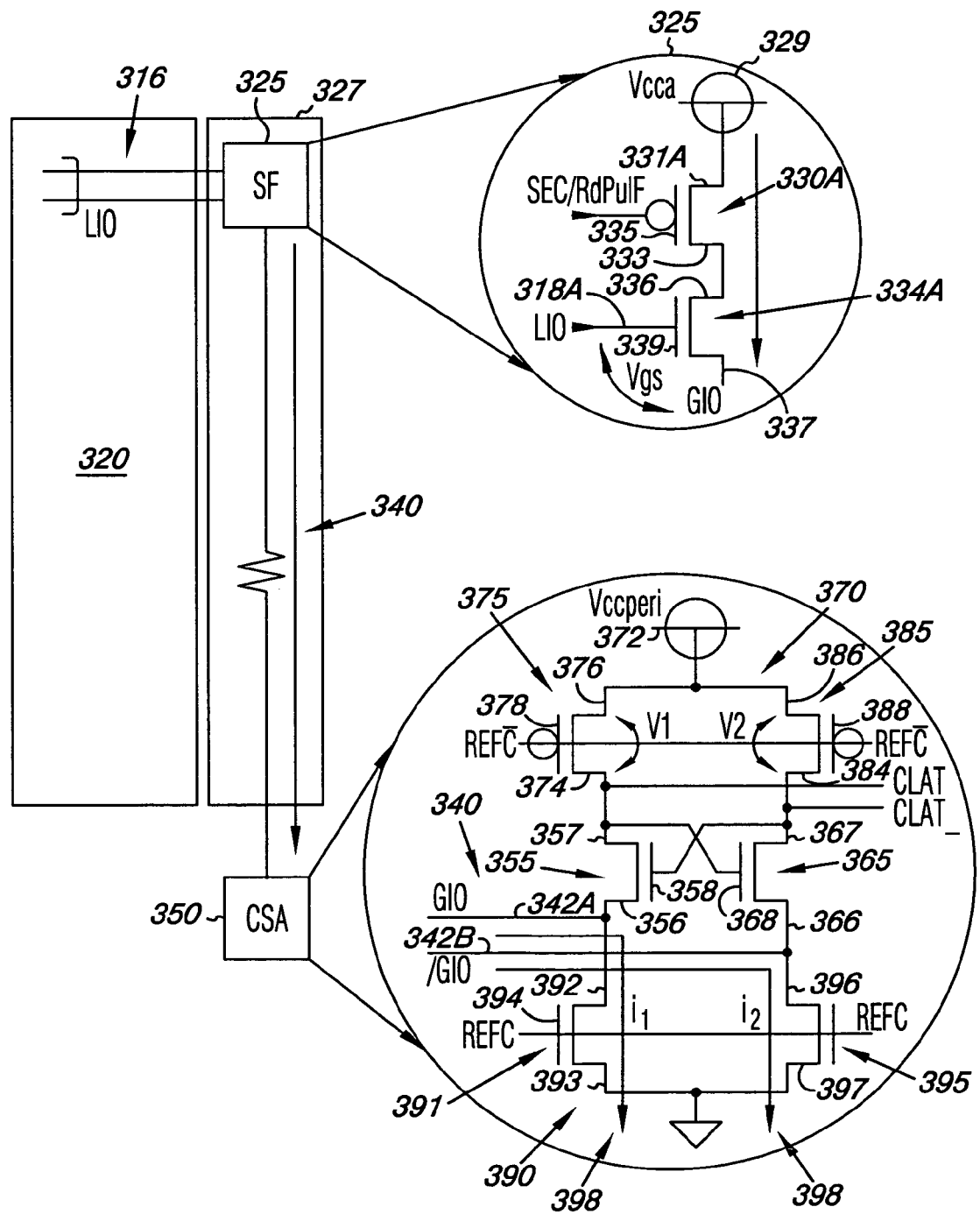

FIGS. 3A and 3B illustrates a data path 300 with a different current sense scheme and with a source follower circuit for a read operation. Aspects of the data path shown in Figure are covered by U.S. Pat. No. 6,944,066, issued Sep. 13, 2005 to Chul Min Jing and assigned to a common assignee as the present disclosure. FIGS. 3A and 3B is discussed to further illustrate embodiments of the present disclosure. The data path 300 of FIG. 3A can be operated under low voltage conditions, such as in memory devices designed for low voltage operation. The data path 300 includes elements similar to the data path 200 shown in FIG. 2. The data path 300 is coupled through a column decoder 348 and sense amplifiers 312 to a memory cell array 320, which is arranged in rows and columns of memory cells. The column decoder 348 selectively couples the pair of digit lines of a selected column of memory to a LIO line 316. As shown in FIG. 3, the LIO 316 is represented by a pair of signal lines 318A, 318B. PMOS transistors 320, 324, 328 are coupled to the LIO 316 for precharging the signal lines 318A, 318B to an internal voltage level VINT in response to an active LOW precharge signal PRE_. That is, when the PRE_ signal has a LOW logic level, the PMOS transistors 320, 324, 328 are activated to couple the signal lines 318A, 318B to a VINT voltage supply, as well as to couple the signal lines to each other to balance the voltage levels.

Figure 1:
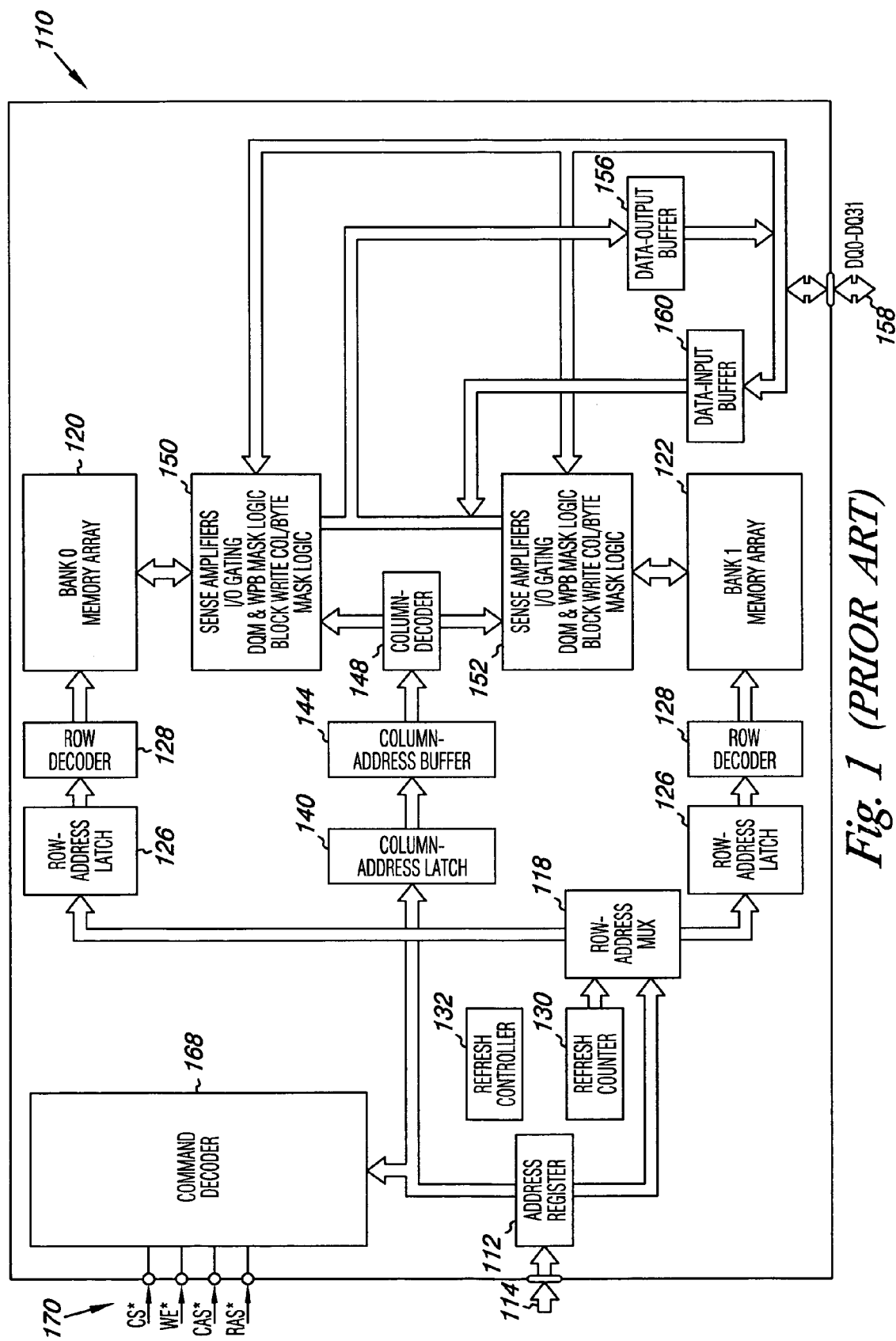
FIG. 1 illustrates an example memory device.

Each of the signal lines 318A, 318B of the LIO 316 are coupled to a gate of a respective NMOS transistor 334A, 334B. The drains of the NMOS transistors are coupled to drains of respective PMOS transistors 330A, 330B, which couple the NMOS transistors to 334A, 334B, respectively, to a VINT voltage supply in response to an active LOW section selection signal SEC_. The sources of the NMOS transistors 334A, 334B are coupled to respective signal lines 352A, 352B of a GIO line 350. As with the conventional data path 200 in FIG. 2, the signal lines 352A, 352B of the GIO 350 are typically physically long lines that have relatively significant inherent line impedance. A current sense amplifier 350 is coupled to the GIO 350 to detect current differences between the two signal lines 352A, 352B and generate output voltage signals CLAT, CLAT_ in response to the sensing. The CLAT and CLAT_ signals have complementary logic levels, and are provided to the output buffer, e.g. 156 in FIG. 1.

In operation, the LIO 316 is initially precharged to the VINT voltage level by a LOW PRE_ signal and the GIO 350 is precharged to a precharge voltage VPRE, which is typically approximately one-half the VINT voltage level. It will be appreciated by those ordinarily skilled in the art, however, that different voltage levels can be used to precharge the signal lines 352A, 352B, as well as the signal lines 318A, 318B. As a result of the HIGH logic level of the signal lines 352A, 352B, the NMOS transistors are switched ON. In preparation for a memory access operation, the PRE_ signal returns to a HIGH logic level, and the SEC_ signal becomes LOW, switching ON the PMOS transistors 330A, 330B. At this time, the signal lines 352A, 352B of the GIO 350 are coupled to the VINT voltage supply. Although the signal lines 352A, 352B are precharged to the VPRE voltage level, and are now coupled to the VINT voltage supply, the voltage level of each of the signal lines 352A, 352B does not immediately change due to the inherent line loading of the signal lines 352A, 352B. Prior to voltage level of the signal lines 352A, 352B changing to the VINT voltage, the column decoder 348 selectively couples the digit lines of a selected column of memory to the signal lines 318A, 318B of the LIO 316. The voltage levels of the signal lines 318A, 318B change to complementary logic levels in response to the coupling of the digit lines, which causes one of the NMOS transistors 334A, 334B to switch OFF. The signal line 352A, 352B coupled to the NMOS transistor 334A, 334B that is switched OFF is now decoupled from the VINT voltage supply. As a result, a current difference is created between the signal lines 352A, 352B, with current flowing in the signal line still coupled to the VINT voltage supply and no current flowing in the signal line coupled to the NMOS transistors 334A, 334B that is switched OFF. The current difference is detected by the current sense amplifier 350 and complementary output voltage signals CLAT and CLAT_ are generated accordingly.

The data path 300 of FIG. 3A employs a "quasi-source follower" (SF) of NMOS transistors 334A, 334B in its current mode sensing operation rather than using pass gates 230, 232 as in the conventional data path 200 of FIG. 2. In this manner, the voltage drop across the LIO 316 can be avoided since the voltage levels of the signal lines 318A, 318B are used to switch ON and OFF the NMOS transistors 334A, 334B to couple one of the signal lines 352A, 352B to the VINT voltage supply and decouple the other rather than drive currents in the signal lines 352A, 352B of the GIO line 350.

One of ordinary skill in the art will appreciate from reading this disclosure the manner in which to select suitable device characteristics of the MOS transistors included in the data path 300. Additionally, the data path 300 of FIG. 3A can be implemented using conventional devices and designs well known in the art, as well as those devices and designs later discussed in connection with FIG. 3B.

FIG. 3B illustrates a different level of detail of the data path 300 shown in FIG. 3A. FIG. 3B illustrates the LIO line 316 coupled to the memory cell array 320, the GIO line 350 coupled to a current sense amplifier 350, and the LIO line 316 coupled to the GIO line 350 through the quasi source follower circuit 325. FIG. 3B illustrates a portion of the quasi source follower circuit 325 associated with one of the LIO 316 signal lines, e.g., 318A, in more detail. The portion of the quasi source follower circuit 325 shown illustrates signal line 318A of the LIO 316 coupled to a gate 339 of an NMOS transistor 334A. The drain 336 of the NMOS transistor 334A is coupled to the drain 333 of PMOS transistor 330A which couples the NMOS transistor 334A to a VINT voltage supply 327 (array voltage supply "Vcca"), coupled to the source of PMOS transistor 330A, in response to an active LOW section selection signal SEC_/RdPulF applied to a gate 335 of PMOS transistor 330A. As shown in FIG. 3B, the source 337 of the NMOS transistor 334A is coupled to signal line 352A of a GIO line 350.

FIG. 3B also illustrates an additional level of detail for an embodiment of the current sense amplifier 350 coupled to the GIO line 350. As shown in FIG. 3B, the current sense amplifier 350 includes a pair of PMOS transistors 375, 385 having drains 374, 384 coupled to respective drains 357, 367 of NMOS transistors 355, 365, respectively. The source 376, 386 of the PMOS transistors 375, 385 are coupled to a peripheral voltage supply (Vccperi) 372. The PMOS transistors 375, 385 have gates 378, 388 coupled to ground (or REFC "bar"), and consequently, operate in the linear region of the transistor to provide resistive loading. The gates 358, 368 of the NMOS transistors 355, 365 are cross coupled to the drain 367, 357, respectively, of the other NMOS transistor 365, 355. The current sense amplifier 350 further includes precharge NMOS transistors 391, 395 for coupling the drains 357, 367 of the NMOS transistors 355, 365 to ground when the signal REFC is HIGH. The input currents on signal lines 352A and 352B of the GIO line 350 are coupled to nodes at the source 356, 366, respectively, of the NMOS transistors 355, 365 of the current sense amplifier 350. The voltage output signals CLAT and CLAT_ are coupled to nodes at the drains 357, 367, respectively, of the NMOS transistors 355, 365.

In operation, the current sense amplifier 350 detects current differences between the currents $i_1$ and $i_2$, shown by arrows 398 in FIG. 3B, and generates CLAT and CLAT_ output voltage signals in response. Following precharge of the current sense amplifier 350, it is assumed that the currents $i_1$ and $i_2$ are equal. With respect to the previous description of the data path 300, the currents $i_1$ and $i_2$ are equal after the SEC_ signal has switched to a LOW logic level to couple the signal lines 318A, 318B of the LIO line 316 to the VINT voltage supply, but prior to the column decoder, 348 in FIG. 3A, coupling the digit lines of the selected column of memory 320 to the signal lines 318A, 318B of the LIO 316. As also previously described, in response to the coupling of digit lines to the signal lines 318A, 318B, one of the signal lines 352A, 352B of the GIO 350 is decoupled from the VINT voltage supply. As a result, current will continue to flow in one signal line but not the other, causing a current difference between the signal lines 352A, 352B to be present.

Since the PMOS transistors 375, 385 are operating in the linear region of the transistor, each of the PMOS transistors 375, 385 behaves as a resistor and the current difference between the currents $i_1$ and $i_2$ will cause a difference in the voltage dropped across the PMOS transistors 375, 385, shown in FIG. 3B as V1 and V2, respectively. As a result, one of the voltages V1, V2 will increase relative to the other voltage. Keeping in mind that the inherent loading of the signal lines 352A, 352B of the GIO 350 prevents the voltage levels of the signal lines 352A, 352B from changing quickly, as the voltage across one of the PMOS transistors 375, 385 increases, the gate-source voltage will decrease for the NMOS transistor 355, 365 having its gate coupled to the PMOS transistor that is dropping more voltage. The decreasing gate-source voltage will cause the drain voltage of the same NMOS transistor to increase. The increasing drain voltage of the NMOS transistor provides positive feedback to cause the other NMOS transistor to sink more current. As a result, the voltage dropped across the PMOS further increases. With the voltage dropped across the PMOS transistor continuing to increase, and the drain voltage of the NMOS transistor 355, 365 having its gate coupled to that PMOS transistor continuing to increase, the output signals CLAT and CLAT_ are quickly forced to complementary logic levels.

Following the output of the complementary CLAT and CLAT_ signals, the current sense amplifier 350 can be reset in preparation for another current sensing operation by pulsing the REFC signal to switch ON the NMOS transistors 391, 395 for the duration of the pulse. By coupling the sources 393, 397 of the NMOS transistors 391, 395 to ground, the respective gate-source voltages will be equalized.

It will be appreciated by those ordinarily skilled in the art that the relationship between the currents $i_1$ and $i_2$ and the voltage at the source 356, 366, respectively, of the NMOS transistors 355, 365 represents a "negative ac resistance." That is, for an increasing $i_1$ current, the voltage at source 356 increases as well. The same negative resistance effect occurs at source 366 in the case when the $i_2$ current increases. It will be further appreciated that the current sense amplifier can quickly generate complementary CLAT and CLAT_ signals because of the regenerative action of the positive feedback latch formed by the cross-coupled NMOS transistors 355, 365. As a result of the negative resistance and the regenerative action of the current sense amplifier 350, sensing speed is relatively faster than a conventional current sense amplifier because of the positive feedback. Additionally, the source regions 356, 366, coupled to the signal lines 352A, 352B of the GIO line 350, can be maintained at higher voltage levels to provide good signal source drivability. Also, the signal lines 352A, 352B of the GIO 350, when coupled to the data path 300, are easier to equalize between sensing operations because the voltage levels do not significantly change during the sensing operation itself. These benefits, when implemented in a memory device, can contribute to reducing the overall access cycle time. It will be appreciated by those ordinarily skilled in the art that the benefits previously described may be achieved to a greater or lesser extent without departing from the scope of the present invention.

The current sense amplifier 350, when used with the data path 300 allows for operability of the data path 300 in low voltage conditions. As previously explained with respect to the conventional data path of FIG. 2, for operability the internal voltage should be greater than the voltage drop across the LIO 216, the GIO 240, and the PMOS/diode coupled NMOS legs 260, 270 or 264, 274 of FIG. 2. Under low voltage operating conditions approaching 1.0 volt, the conventional data path can fail to sense data of a memory cell accurately because of this voltage drop. In comparison to the data path 200 (FIG. 2), the minimum internal voltage level for the data path 300 (FIGS. 3A and 3B) when coupled to the current sense amplifier 350 needs to be greater than the voltage drop across the NMOS transistors 334A, 334B, across the GIO 350, and across the NMOS transistors 355, 365. The total voltage drop for the data path 300 and the current sense amplifier 350 is less than that for the data path 200 and the current sense amplifier 250 (FIG. 2). As a result, the data path 300 and the current sense amplifier 350 can operate at a lower voltage than the conventional arrangement shown in FIG. 2.

Nonetheless, as the reader will appreciate, in the above data path 300 the current drivability at the source follower depends strongly on the internal voltage supply VINT (i.e., array voltage supply "Vcca"). In some scenarios however, e.g., low voltage Vcc voltage condition ("Vss"), high temperature "T", and tRCDmin timing, due to a large Vcca dipping, the above quasi source follower 325 may not be able to sufficiently drive the current and possibly lead to a read failure. In order to accomplish the source follower operation, GIO node with leave parasitic load has to move dynamically which consumes a measurable amount of power. As memory chips move on to the 2 Gigabit (2 Gb) and 4 Gb array size the DRAM arrays will have longer and longer I/O architectures, including longer GIO lines in the center logic portion 327 (sometimes called the "Throat") of the array layout. Accordingly, the capacitive load due to the dynamic movement of the GIO will burn more significantly the current in the above data path 300 scheme. The large resistance and capacitance of the GIO may additionally delay the GIO level movement.

Figure 4:
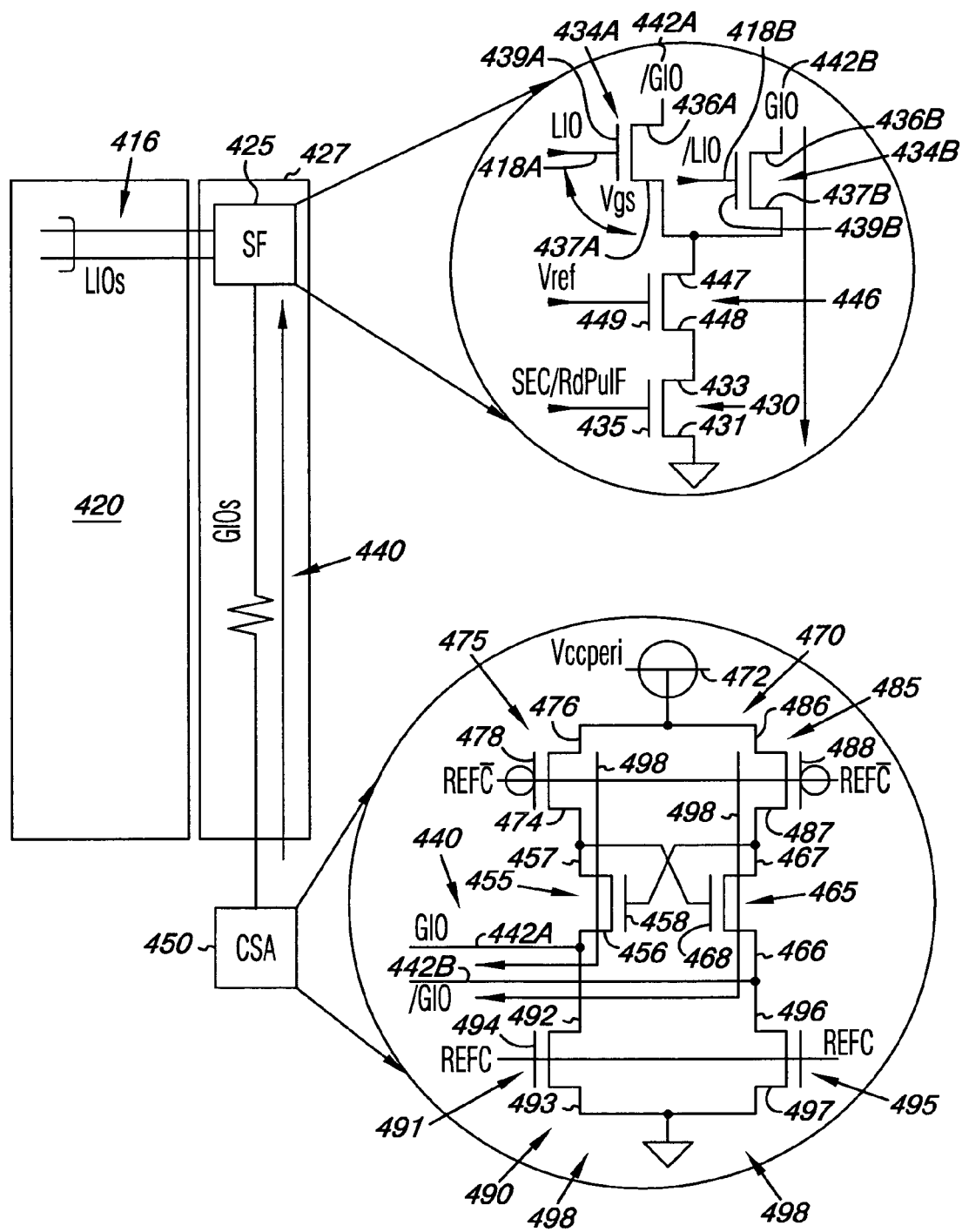
FIG. 4 illustrates an embodiment for an alternative low voltage data path and current sense amplifier.

FIG. 4 illustrates an embodiment for an alternative low voltage data path and current sense amplifier, in consideration of the above mentioned factors, which can be implemented in place of the data path 300 shown in FIGS. 3A and 3B. The embodiment of FIG. 4 illustrates a comparable level of detail to that presented in FIG. 3B for the data path. Thus, FIG. 4 illustrates the LIO line 416 coupled to the memory cell array 420 and the GIO line 440 coupled to a current sense amplifier 450. In the embodiment of FIG. 4, the LIO line 416 is coupled to the GIO line 440 through source follower (SF) circuit 425. FIG. 4 also illustrates in more detail one embodiment (additional embodiments shown in FIGS. 7B and 7C) of the source follower circuit 425 which can be coupled to the signal lines 418A and 418B (also referred to herein as first and second signal lines) of the LIO 416. The illustrated source follower circuit 425 embodiment shows signal lines 418A and 418B of the LIO 416 coupled to a pair of source coupled NMOS transistors 434A and 434B, respectively (also referred to as first and second NMOS transistors. Each signal line 418A and 418B is coupled to a gate 439A and 439B of the NMOS transistors 434A and 434B respectively.

As shown in FIG. 4, the drain 436A and 436B of each of the NMOS transistors 434A and 434B is coupled to a respective signal line 442A and 442B of the GIO 440. The sources 437A and 437B of the first and second NMOS transistors 434A and 434B are coupled to a source 447 of a third NMOS transistor 446. As shown in the embodiment of FIG. 4, the gate 449 of the third NMOS transistor 446 is coupled to a reference voltage supply (Vref). A fourth NMOS transistor 430 has a source 431 coupled to a ground and a drain 433 coupled to a drain 448 of the third NMOS transistor 446. In source follower circuit 425 the section selection signal SEC/RdPulF is applied to the gate 435 of the fourth NMOS transistor 430. The signal lines 442A and 442B of the GIO 440 coupled to the drain 436A and 436B of the first and the second NMOS transistors 434A and 434B are thus coupled to ground in response to an active HIGH section selection signal SEC_/RdPulF applied to a gate 435 of the fourth NMOS transistor 430. Hence, as one of ordinary skill in the art will appreciate, an open drain like source follower operation is created by the positioning of the third NMOS transistor 446.

The embodiment of FIG. 4 illustrates an additional level of detail for an embodiment of the current sense amplifier 450 coupled to the GIO line 440. As shown in FIG. 4, the current sense amplifier 450 includes a pair of PMOS transistors 475, 485 having drains 474, 484 coupled to respective drains 457, 467 of NMOS transistors 455, 465, respectively. Similar to amplifier 350 in FIG. 3, the PMOS transistors 475, 485 in FIG. 4 have gates 478, 488 coupled to ground (or REFC "bar"), and consequently, operate in the linear region of the transistor to provide resistive loading. Likewise, the gates 458, 468 of the NMOS transistors 455, 465 are cross coupled to the drain 467, 457, respectively, of the other NMOS transistor 465, 455. The current sense amplifier 450 further again includes precharge NMOS transistors 491, 495 for coupling the drains 457, 467 of the NMOS transistors 455, 465 to ground when the signal REFC is HIGH. The input currents on signal lines 442A and 442B of the GIO line 440 are coupled to nodes at the source 456, 466, respectively, of the NMOS transistors 455, 465 of the current sense amplifier 450. And, the voltage output signals CLAT and CLAT_ are coupled to nodes at the drains 457, 467, respectively, of the NMOS transistors 455, 465. The source 476, 486 of the PMOS transistors 475, 485 are coupled to a peripheral voltage supply ("Vccperi") 472.

The operation of the current sense amplifier 450 in FIG. 4 is analogous to that described in connection with FIG. 3B. However, as provided by this embodiment, coupling the LIO line 416 to the GIO line 440 through source follower (SF) circuit 425 provides relief from Vcca dipping issues mentioned above in connection with FIG. 3B. That is, in the source follower circuit 425 and current sense amplifier 450 of FIG. 4 there is no influence on the GIO 440 caused by Vcca dipping since no Vcca power is used. This results in a stable current operation even at low Vcc conditions. The source follower circuit 425 and current sense amplifier 450 configuration of FIG. 4 effectively reverses the current direction to that present in the configuration of FIG. 3B. That is, in the source follower circuit 425 and current sense amplifier 450 configuration of FIG. 4 the current flows from the current sense amplifier 450 toward the source follower circuit 425 through the center logic portion ("throat") of the array scheme. As the reader will further appreciate, the source follower circuit 425 and current sense amplifier 450 of FIG. 4 provide relief from the GIO 440 dynamic voltage swing since the source follower circuit 425 has small load nodes for the source follower operation. In effect, the GIO 440 will not significantly move and hence lower power consumption can be realized.

Although described in operation with a data path 300 having a quasi-source follower current sensing scheme or the source follower (SF) circuit 425 scheme, the current sense amplifier 400 can also be used with conventional data paths as well. For example, the current sense amplifier 400 can be coupled to the conventional data path 100 (FIG. 2) in which pass gates 130, 132 are used to couple the signal lines of the LIO 116 to the signal lines of the GIO 140. In addition to the benefits resulting from the negative resistance and the regenerative action of the current sense amplifier 400 previously discussed, the current sense amplifier 400 can be used advantageously with the data path 100 to enable operation at lower voltages than for the conventional current sense amplifier, such as the current sense amplifier 150 of FIG. 2, since the voltage drop for the current sense amplifier 400 is less than that for the current sense amplifier 150.

Figure 5:
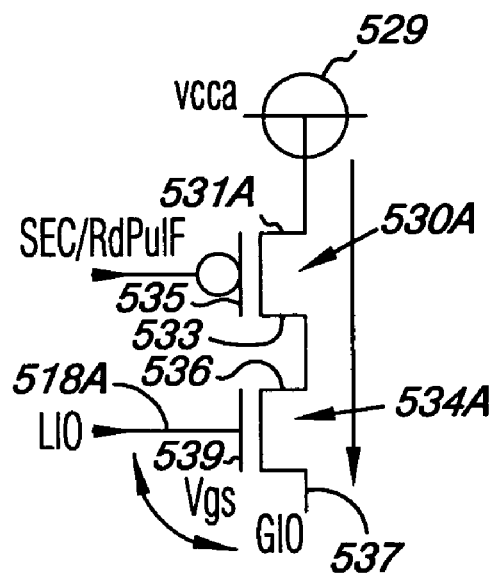
FIG. 5 illustrates a quasi source follower circuit coupling an LIO to a GIO.

FIG. 5 illustrates a quasi source follower circuit coupling an LIO to a GIO. The quasi source follower circuit shown in FIG. 5 is the same as the one described in connection with FIG. 3B. Hence, FIG. 5 shows a portion of the quasi source follower circuit associated with one signal line 518A of an LIO. The portion of the quasi source follower circuit shown illustrates signal line 518A of the LIO coupled to a gate 539 of an NMOS transistor 534A. The drain 536 of the NMOS transistor 534A is coupled to the drain 533 of PMOS transistor 530A, which couples the NMOS transistor 534A to an internal voltage supply 527 (array voltage supply "Vcca"), in response to an active LOW section selection signal SEC_/RdPulF applied to a gate 535 of PMOS transistor 530A. As shown in FIG. 5, the source 537 of the NMOS transistor 534A is coupled to signal line of a GIO. As mentioned previously, one potential issue with use of this circuit in larger memory array schemes, e.g., 2 Gb on to 4 Gb, is that in this configuration the current drivability at the source follower depends on Vcca. As the reader will appreciate the current source is the array power at the far end of the memory chip. Here, the current drivability can be influenced by variations in the array power level. Hence, the current drivability will be influenced by Vcca dipping caused by sense amplifier activation.

Figure 6:
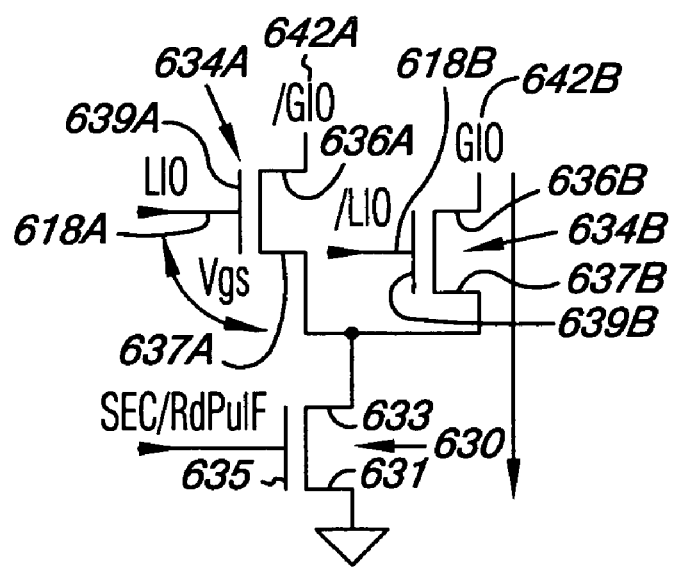
FIG. 6 illustrates an open drain scheme coupling an LIO to a GIO.

FIG. 6 illustrates an open drain scheme coupling an LIO to a GIO. In the open drain scheme of FIG. 6 signal lines 618A and 618B of an LIO 616 are coupled to a pair of source coupled NMOS transistors 634A and 634B, respectively. Each signal line 618A and 618B is coupled to a gate 639A and 639B of the NMOS transistors 634A and 634B respectively. As shown in FIG. 6, the drain 636A and 636B of each of the NMOS transistors 634A and 634B is coupled to a respective signal line 642A and 642B of a GIO. The sources 637A and 637B of the NMOS transistors 434A and 434B are coupled to a drain 633 of another NMOS transistor 630 which has a source 431 coupled to ground. In this open drain scheme the section selection signal SEC/RdPulF is applied to the gate 635 of NMOS transistor 630. The signal lines 642A and 642B of the GIO, coupled to the drain 636A and 636B of the NMOS transistors 634A and 634B are thus coupled to ground in response to an active HIGH section selection signal SEC_/RdPulF applied to a gate 635 of NMOS transistor 630.

One potential issue with use of this circuit in larger memory array schemes, e.g., 2 Gb on to 4 Gb, and with lower power implementations is that the Vgs may be too large for the NMOS transistors 634A and 634B to detect the Vgs difference resulting in a small current difference signal lines 642A and 642B of the GIO and potential sensing operation delay. If the Vds is large enough the NMOS transistors 634A and 634B will operate in the saturated region. Here, the drain current Id of the NMOS transistors 634A and 634B representing the current difference on the signal lines 642A and 642B of the GIO is in proportion to $(Vgs-Vth)^2$.

Figure 7A:
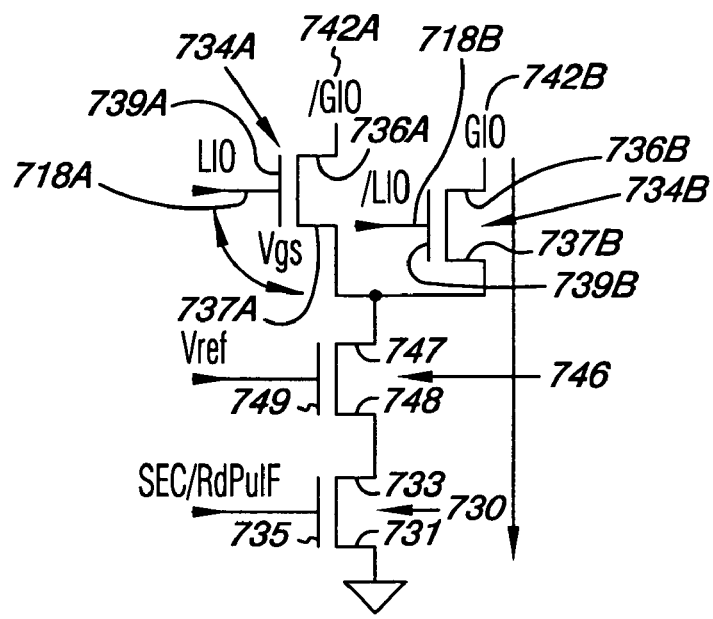
FIGS. 7A-7C illustrates various source follower embodiments coupling an LIO to a GIO.
Figure 7B:
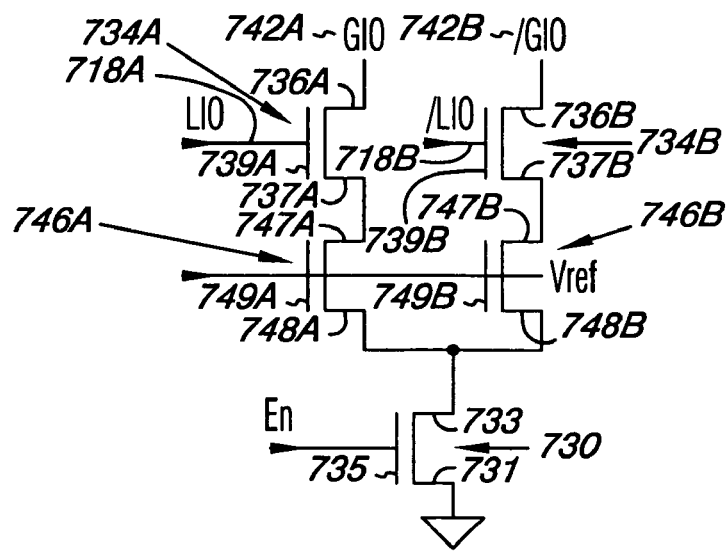
Figure 7C:
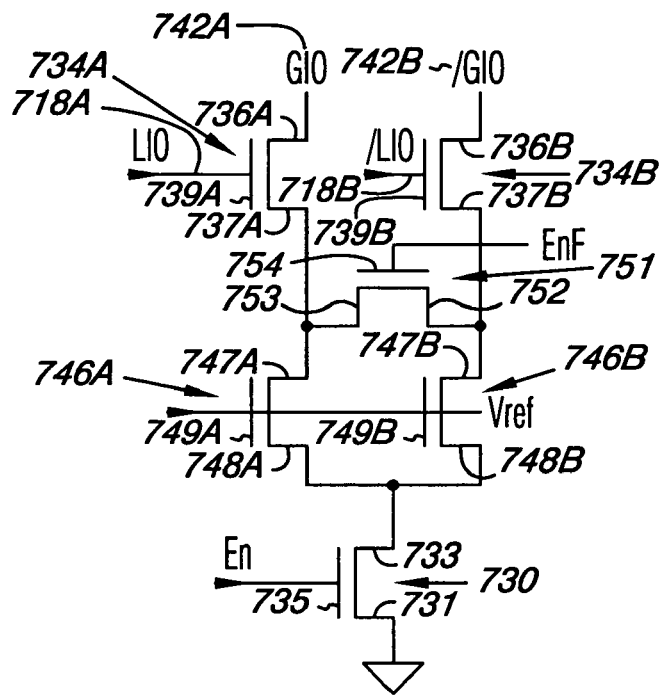

FIGS. 7A-7C illustrates various source follower embodiments coupling an LIO to a GIO according to the present disclosure. FIG. 7A illustrates the embodiment discussed in connection with FIG. 4. Thus, the source follower circuit shows signal lines 718A and 718B of the LIO coupled to a pair of source coupled NMOS transistors 734A and 734B, respectively (also referred to as first and second NMOS transistors). Each signal line 718A and 718B is coupled to a gate 739A and 739B of the NMOS transistors 734A and 734B respectively.

As shown in the embodiment of FIG. 7A, the drain 736A and 736B of each of the NMOS transistors 734A and 734B is coupled to a respective signal line 742A and 742B of a GIO. The sources 737A and 737B of the first and second NMOS transistors 734A and 734B are coupled to a source 747 of a third NMOS transistor 746. As shown in the embodiment of FIG. 7A, the gate 749 of the third NMOS transistor 746 is coupled to a reference voltage supply (Vref). A fourth NMOS transistor 730 has a source 731 coupled to a ground and a drain 733 coupled to a drain 748 of the third NMOS transistor 746. In source follower circuit 725 the section selection signal SEC/RdPulF is applied to the gate 735 of the fourth NMOS transistor 730. The signal lines 742A and 742B of the GIO 740, coupled to the drain 736A and 736B of the first and the second NMOS transistors 734A and 734B, are coupled to ground in response to an active HIGH section selection signal SEC_/RdPulF applied to a gate 735 of the fourth NMOS transistor 730. Hence, an open drain like source follower operation is created by the positioning of the third NMOS transistor 746.

However, as one of ordinary skill in the art will appreciate, with the embodiment of FIG. 7A there is no Vcca dependency and no sense speed dependency. Further the embodiment of FIG. 7A provides a smaller Vgs as compared to the open drain scheme of FIG. 6. Implementation of the third NMOS transistor 746 provides for a source follower operation for a small load node at the connection between the sources 737A and 737B of the first and second NMOS transistors 734A and 734B and the source 747 of the third NMOS transistor 746. In this embodiment, as the first and second NMOS transistors 734A and 734B operate in the linear regions due to a small VDS, the current drivability has both Vgs and Vds dependency.

The embodiment of FIG. 7B is a variation of the embodiment shown in FIG. 7A. The embodiment shows signal lines 718A and 718B of the LIO coupled to a gate 739A and 739B of the first and second NMOS transistors 434A and 434B respectively. In the embodiment of FIG. 7B, however, the source nodes 737A and 737B of the first and second NMOS transistors 734A and 734B are separated. The drain 736A and 736B of each of the NMOS transistors 734A and 734B is coupled to a respective signal line 742A and 742B of a GIO. The sources 737A and 737B of the first and second NMOS transistors 734A and 734B are each independently coupled to a source 747A and 747B of a pair of drain coupled NMOS transistors 746A and 746B respectively (also referred to as third and fourth NMOS transistors). As shown in the embodiment of FIG. 7, the gates 749A and 749B of the third and fourth NMOS transistors 746A and 746B are coupled together and to a reference voltage supply (Vref). A fifth NMOS transistor 730 has a source 731 coupled to a ground and a drain 733 coupled to the coupled drains 748A and 748B of the third and fourth NMOS transistors 746A and 746B. In the embodiment of FIG. 7B the section selection signal SEC/RdPulF is applied to the gate 735 of the fifth NMOS transistor 730.

The embodiment of FIG. 7C is a variation of the embodiment shown in FIG. 7B. The embodiment of FIG. 7C includes the same circuit configuration as that shown in FIG. 7B with the addition of a sixth NMOS transistor to equilibrate between the source regions 737A and 737B of the first and second NMOS transistors 734A and 734B. Thus, the embodiment of FIG. 7C illustrates a sixth NMOS transistor 751 having a drain 753 coupled to a source region 737A of the first NMOS transistor 734A, a source 752 coupled to a source region 737B of the second NMOS transistor 734B and a gate 754 to which an equilibrate signal is applied such that during an equilibration period the separated sources 737A and 737B of the first and second NMOS transistors 734A and 734B are equalized.

Figure 8:
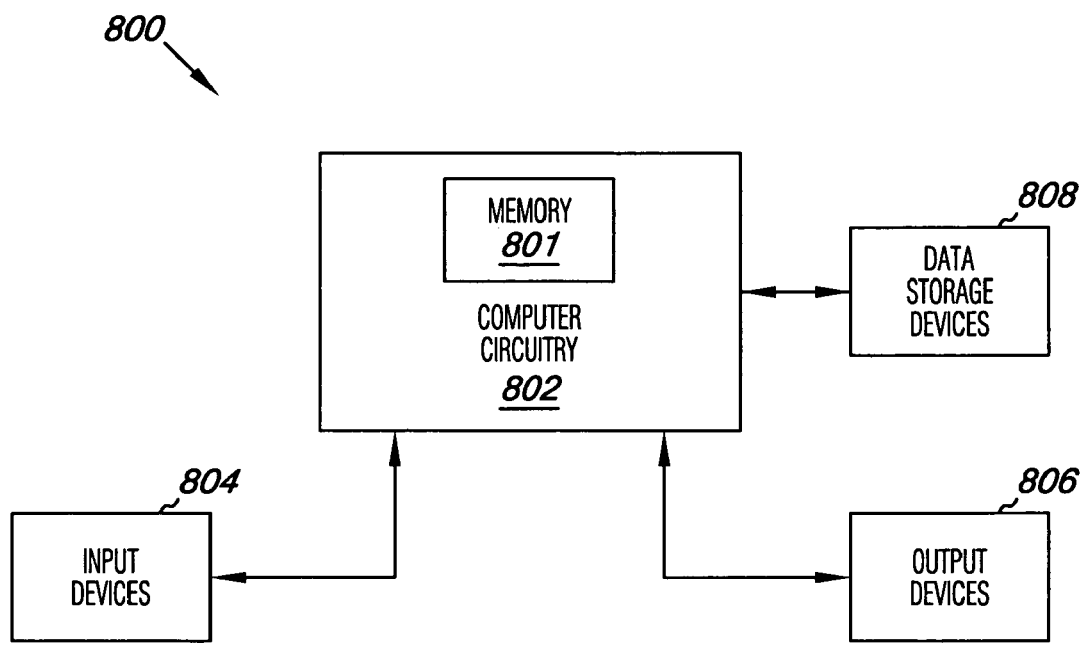
FIG. 8 is a block diagram of a processor-based system having a memory device in which the data path according to an embodiment of the present invention can be implemented.

FIG. 8 is a block diagram of a processor-based system including computer circuitry 802 having a memory device 801 in which a data path and/or current sense amplifier according to an embodiment of the present invention can be implemented. The computer circuitry 802 is coupled through address, data, and control buses to the memory device 801 to provide for writing data to and reading data from the memory device. The computer circuitry 802 includes circuitry for performing various computing functions, such as executing specific software to perform specific calculations or tasks. In addition, the computer system 800 includes one or more input devices 804, such as a keyboard or a mouse, coupled to the computer circuitry 802 to allow an operator to interface with the computer system. The computer system 800 also includes one or more output devices 806 coupled to the computer circuitry 802, such as output devices typically including a printer and a video terminal, etc. One or more data storage devices 808 can be coupled to the computer circuitry 802 to store data and/or retrieve data from external storage. Examples of typical storage devices 808 include hard and floppy disks, tape cassettes, compact disk read-only (CD- ROMs) and compact disk read-write (CD-RW) memories, digital video disks (DVDs), etc.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A data path coupled to a read/write circuit, comprising:
   a local input/output (LIO) line having first and second signal lines coupled to the read/write circuit;
   a global input/output (GIO) line having first and second signal lines; and
   a source follower circuit, wherein the source follower circuit includes:
      first and second n-channel MOS (NMOS) transistors having a drain coupled to the first and the second signal lines of the GIO respectively, a gate coupled to the first and the second signal lines of the LIO respectively, and a source coupled together;
      a third NMOS transistor having a source coupled to the source of the first and the second NMOS transistors and a gate coupled to a reference voltage supply; and
      a fourth NMOS transistor having a drain coupled to a drain of the third NMOS transistor, a gate to which a selection signal is applied, and a source coupled to a ground.

2. The data path of claim 1, wherein the data path includes an output data amplifier coupled to the first and the second lines of the GIO.

3. The data path of claim 2, wherein the output data amplifier is a current sense amplifier.

4. The data path of claim 3, wherein the current sense amplifier comprises:
   first and second load circuits, each load circuit having a first terminal coupled to a peripheral voltage supply and further having a second terminal;
   first and second NMOS transistors, each NMOS transistor having a drain terminal coupled to the second terminal of a respective load circuit and further coupled to an output buffer to provide complementary output voltage signals, a gate coupled to the drain of the other NMOS transistor, and a source coupled to the first and the second lines of the GIO; and
   a precharge circuit coupled to the source of the first and the second NMOS transistors.

5. The data path of claim 4, wherein the precharge circuit includes a first and a second precharge transistor, each having a drain coupled to the source of a respective NMOS transistor, a gate to which a precharge activation signal is applied, and a source coupled to a ground.

6. A data path coupled to a read/write circuit, comprising:
   a local input/output (LIO) line having first and second signal lines coupled to the read/write circuit;
   a global input/output (GIO) line having first and second signal lines; and
   a source follower circuit, wherein the source follower circuit includes:
      first and second n-channel MOS (NMOS) transistors having a drain coupled to the first and the second signal lines of the GIO respectively, a gate coupled to the first and the second signal lines of the LIO respectively;
      third and fourth NMOS transistors having a source coupled to a source of the first and the second NMOS transistors respectively, a gate coupled to a reference voltage supply, and a drain coupled together; and
      a fifth NMOS transistor having a drain coupled to the drain of the third and fourth NMOS transistors, a gate to which a selection signal is applied, and a source coupled to a ground.

7. A data path coupled to a read/write circuit, comprising:
   a local input/output (LIO) line having first and second signal lines coupled to the read/write circuit;
   a global input/output (GIO) line having first and second signal lines; and
   a source follower circuit, wherein the source follower circuit includes:
      first and second n-channel MOS (NMOS) transistors having a drain coupled to the first and the second signal lines of the GIO respectively, a gate coupled to the first and the second signal lines of the LIO respectively;
      third and fourth NMOS transistors having a source coupled to a source of the first and the second NMOS transistors respectively, a gate coupled to a reference voltage supply, and a drain coupled together;
      a fifth NMOS transistor having a drain coupled to the drain of the third and fourth NMOS transistors, a gate to which a selection signal is applied, and a source coupled to a ground; and
      a sixth NMOS transistor having a drain coupled to a source region of the first NMOS transistor, a source coupled to a source region of the second NMOS transistor and a gate to which an equilibrate signal is applied.

8. A current sense amplifier, comprising:
   first and second load circuits, each load circuit having a first terminal coupled to a peripheral voltage supply and further having a second terminal;
   first and second NMOS transistors, each NMOS transistor having a drain terminal coupled to the second terminal of a respective load circuit and further coupled to an output buffer to provide complementary output voltage signals, a gate coupled to the drain of the other NMOS transistor, and a source coupled to first and second lines of a GIO line;
   a precharge circuit coupled to the source of the first and the second NMOS transistors; and
   wherein the first and the second lines of the GIO are coupled to a source follower circuit that includes;

first and second n-channel MOS (NMOS) transistors having a drain coupled to the first and the second signal lines of the GIO respectively, a gate coupled to first and second signal lines of a LIO line respectively, and a source coupled together;

a third NMOS transistor having a source coupled to the source of the first and the second NMOS transistors and a gate coupled to a reference voltage supply; and a fourth NMOS transistor having a drain coupled to a drain of the third NMOS transistor, a gate to which a selection signal is applied, and a source coupled to a around.

9. The amplifier of claim 8, wherein the precharge circuit includes a third and a fourth NMOS transistor, each having a drain coupled to the source of the first and the second NMOS transistors respectively, a gate to which a precharge activation signal is applied, and a source coupled together and to a ground.

10. The amplifier of claim 8, wherein the first and second load circuits are resistive load devices.

11. A data path coupled to a read/write circuit, comprising:
a local input/output (LIO) line having first and second signal lines coupled to the read/write circuit;
a global input/output (GIO) line having first and second signal lines;
a source follower circuit, wherein the source follower circuit includes:
first and second n-channel MOS (NMOS) transistors having a drain coupled to the first and the second signal lines of the GIO respectively, a gate coupled to the first and the second signal lines of the LIO respectively, and a source coupled together;
a third NMOS transistor having a source coupled to the source of the first and the second NMOS transistors and a gate coupled to a reference voltage supply; and
a fourth NMOS transistor having a drain coupled to a drain of the third NMOS transistor, a gate to which a selection signal is applied, and a source coupled to a ground; and
a current sense amplifier, wherein the current sense amplifier includes:
first and second load circuits, each load circuit having a first terminal coupled to a peripheral voltage supply and further having a second terminal;
first and second NMOS transistors, each NMOS transistor having a drain terminal coupled to the second terminal of a respective load circuit and further coupled to an output buffer to provide complementary output voltage signals, a gate coupled to the drain of the other NMOS transistor, and a source coupled to the first and second lines of the GIO; and
a precharge circuit coupled to the source of the first and the second NMOS transistors.

12. The data path of claim 11, wherein the first and second load circuits of the amplifier include first and second p-channel MOS (PMOS) transistors, each having a source coupled to the peripheral voltage supply, a gate coupled to a ground, and a drain coupled to the drain of the first and second NMOS transistors respectively.

13. A memory device, comprising:
an address bus;
a control bus;
an address decoder coupled to the address bus;
a control circuit coupled to the control bus;
a memory cell array coupled to the address decoder and the control circuit;
a read/write circuit coupled to the memory cell array; and a data path coupled to a read/write circuit, wherein the data path includes:
a local input/output (LIO) line having first and second signal lines coupled to the read/write circuit;
a global input/output (GIO) line having first and second signal lines; and
a source follower circuit including:
first and second n-channel MOS (NMOS) transistors having a drain coupled to the first and the second signal lines of the GIO respectively, a gate coupled to the first and the second signal lines of the LIO respectively, and a source coupled together;
a third NMOS transistor having a source coupled to the source of the first and the second NMOS transistors and a gate coupled to a reference voltage supply; and
a fourth NMOS transistor having a drain coupled to a drain of the third NMOS transistor, a gate to which a selection signal is applied, and a source coupled to a ground.

14. The memory device of claim 13, wherein the data path includes a current sense amplifier coupled to the first and the second lines of the GIO, wherein the current sense amplifier includes:
first and second load circuits, each load circuit having a first terminal coupled to a peripheral voltage supply and further having a second terminal;
first and second NMOS transistors, each NMOS transistor having a drain terminal coupled to the second terminal of a respective load circuit and further coupled to an output buffer to provide complementary output voltage signals, a gate coupled to the drain of the other NMOS transistor, and a source coupled to the first and the second lines of the GIO; and
a precharge circuit coupled to the source of the first and the second NMOS transistors.

15. A memory device, comprising:
a memory array coupled to a read/write circuit;
an output buffer; and
a data path coupled between the read/write circuit and the output buffer, wherein the data path includes:
a local input/output (LIO) line and a global input/output (GIO) line coupled by a source follower circuit, first and second signal lines of LIO line coupled to the read/write circuit and first and second signal lines of the GIO coupled to a current sense amplifier, the current sense amplifier coupled to the output buffer; and
wherein the source follower circuit includes:
first and second n-channel MOS (NMOS) transistors having a drain coupled to the first and the second signal lines of the GIO respectively and a gate coupled to the first and the second signal lines of the LIO respectively;
a third NMOS transistor having a source coupled to a source of the first and the second NMOS transistors and a gate coupled to a reference voltage supply; and
a fourth NMOS transistor having a drain coupled to a drain of the third NMOS transistor, a gate to which a selection signal is applied, and a source coupled to a ground.

16. The memory device of claim 15, wherein the current sense amplifier includes:
first and second load circuits, each load circuit having a first terminal coupled to a peripheral voltage supply and further having a second terminal;

first and second NMOS transistors, each NMOS transistor having a drain terminal coupled to the second terminal of a respective load circuit and further coupled to an output buffer to provide complementary output voltage signals, a gate coupled to the drain of the other NMOS transistor, and a source coupled to the first and second lines of the GIO; and a precharge circuit coupled to the source of the first and the second NMOS transistors.

17. A processor based system, comprising:
a data input device;
a data output device;
a processor coupled to the data input and output devices; and
a memory device coupled to the processor, wherein the memory device includes a data path coupled between a read/write circuit of a memory array and an output buffer, wherein the data path includes a local input/output (LIO) line and a global input/output (GIO) line coupled by a source follower circuit, first and second signal lines of LIO line coupled to the read/write circuit and first and second signal lines of the GIO coupled to a current sense amplifier, the current sense amplifier coupled to the output buffer, wherein the source follower circuit includes:
first and second n-channel MOS (NMOS) transistors having a drain coupled to the first and the second signal lines of the GIO respectively and a gate coupled to the first and the second signal lines of the LIO respectively;
a third NMOS transistor having a source coupled to a source of the first and the second NMOS transistors and a gate coupled to a reference voltage supply; and
a fourth NMOS transistor having a drain coupled to a drain of the third NMOS transistor, a gate to which a selection signal is applied, and a source coupled to a ground.

18. A method of coupling data from a read/write circuit to an output buffer, comprising:
coupling first and the second signal lines of a GIO to a drain of first and second n-channel MOS (NMOS) transistors, respectively, in a source follower circuit;
coupling first and the second signal lines of a LIO to a gate of the first and second NMOS transistors respectively, the first and second signal lines of the LIO coupled to the read/write circuit;
coupling a reference voltage supply to a gate of a third NMOS transistor in the source follower circuit, the third NMOS transistor having a source coupled to a source of the first and the second NMOS transistors;
coupling a drain of a fourth NMOS transistor in the source follower circuit to a drain of the third NMOS transistor, the fourth NMOS transistor having a source coupled to a ground; and
coupling a gate of the fourth NMOS transistor to a selection signal.

19. The method of claim 18, wherein the method includes sensing a current difference between the first and second signal lines of the GIO.

20. The method of claim 18, wherein the method includes:
coupling the first and the second signal lines of a GIO to a source of first and second NMOS transistors, respectively, in a current sense amplifier;
coupling a drain in each NMOS transistor to a load circuit, the load circuit having a first terminal coupled to a peripheral voltage supply and a second terminal coupled to the drain in each NMOS transistor respectively, a gate of each NMOS transistor coupled to the drain of the other NMOS transistor; and
coupling a precharge circuit to the source of the first and the second NMOS transistors.

21. The method of claim 20, wherein coupling a drain in each NMOS transistor to a load circuit includes coupling the drain in each NMOS transistor to a drain of first and second p-channel MOS (PMOS) transistors respectively, each PMOS transistor having a source coupled to the peripheral voltage supply and a gate coupled to a ground.

22. The method of claim 20, wherein coupling a precharge circuit to the source of the first and the second NMOS transistors includes:
coupling a drain of a third and a fourth NMOS transistor to the source of the first and the second NMOS transistors respectively, the third and the fourth NMOS transistors having a source coupled together and to a ground; and
coupling a precharge activation signal to a gate of the third and fourth NMOS transistors.

23. A method for coupling data from a read/write circuit to an output buffer, comprising:
coupling a local input/output (LIO) line and a global input/output (GIO) line through a source follower circuit, wherein first and second signal lines of the LIO line are coupled to the read/write circuit and first and second signal lines of the GIO are coupled to a current sense amplifier, such that a current flows from the current sense amplifier to the source follower circuit during a read operation, and wherein the source follower circuit includes;
first and second n-channel MOS (NMOS) transistors having a drain coupled to the first and the second signal lines of the GIO respectively, a gate coupled to first and second signal lines of a LIO line respectively, and a source coupled together;
a third NMOS transistor having a source coupled to the source of the first and the second NMOS transistors and a gate coupled to a reference voltage supply; and
a fourth NMOS transistor having a drain coupled to a drain of the third NMOS transistor, a gate to which a selection signal is applied, and a source coupled to a ground;
sensing a current difference between the first and second signal lines of the GIO; and
generating an output voltage signal based on the sensed current difference.

24. A method of forming a data path for a read/write circuit, comprising:
forming a source follower circuit in a center logic portion of a dynamic random access memory (DRAM) array, wherein forming the source follower circuit includes:
forming a first and a second n-channel MOS (NMOS) transistor having a source coupled together;
forming a third NMOS transistor having a source coupled to the source of the first and the second NMOS transistors and a gate coupled to a reference voltage supply; and
forming a fourth NMOS transistor having a drain coupled to a drain of the third NMOS transistor, a gate coupled to a selection signal line, and a source coupled to a ground;
forming a local input/output (LIO) line to have first and second signal lines coupled to a read/write circuit and to a gate of first and second NMOS transistors respectively; and forming a global input/output (GIO) line to have first and second signal lines coupled to a drain of the first and second NMOS transistors respectively.

25. The method of claim 24, wherein the method further comprising:
forming a current sense amplifier, wherein forming the sense amplifier includes:
forming a first and a second load circuit with each load circuit having a first terminal coupled to a peripheral voltage supply and further having a second terminal;
forming a first and a second NMOS transistor with each NMOS transistor having a drain terminal coupled to the second terminal of a respective load circuit and to an output buffer, a gate coupled to the drain of the other NMOS transistor, and a source coupled to the first and the second lines of the GIO; and
forming a precharge circuit coupled to the source of the first and the second NMOS transistors.

26. The method of claim 25, wherein forming a first and a second load circuit includes forming a first and a second p-channel MOS (PMOS) transistor with each PMOS transistor having a source coupled to the peripheral voltage supply, a gate coupled to a ground, and a drain coupled to the drain of the first and second NMOS transistors of the amplifier respectively.

27. The method of claim 25 wherein forming the precharge circuit of the amplifier includes forming a third and a fourth NMOS transistor with the third and fourth NMOS transistors each having a drain coupled to the source of the first and the second NMOS transistors respectively, a gate coupled to a precharge activation signal line, and a source coupled together and to a ground.

28. A method of forming a data path for a read/write circuit, comprising:
forming a local input/output (LIO) line having first and second signal lines coupled to the read/write circuit;
forming a global input/output (GIO) line having first and second signal lines coupled to a current sense amplifier; and
forming a source follower circuit to connect the first and second signal lines of the GIO to the first and second signal lines of the LIO such that a current flows from the current sense amplifier to the source follower circuit during a read operation;
wherein the source follower circuit includes:
first and second n-channel MOS (NMOS) transistors having a drain coupled to the first and the second signal lines of the GIO respectively, a gate coupled to the first and second signal lines of the LIO line respectively, and a source coupled together;
a third NMOS transistor having a source coupled to the source of the first and the second NMOS transistors and a gate coupled to a reference voltage supply; and
a fourth NMOS transistor having a drain coupled to a drain of the third NMOS transistor, a gate to which a selection signal is applied, and a source coupled to a ground.

* * * * *

UNITED STATES PATENT AND TRADEMARK OFFICE
CERTIFICATE OF CORRECTION

PATENT NO. : 7,466,615 B2  
APPLICATION NO. : 11/358089  
DATED : December 16, 2008  
INVENTOR(S) : Tomishima Page 1 of 1

It is certified that error appears in the above-identified patent and that said Letters Patent is hereby corrected as shown below:

In column 14, line 67, in Claim 8, delete "includes;" and insert -- includes: --, therefor.

In column 15, line 12, in Claim 8, delete "around." and insert -- ground. --, therefor.

In column 18, line 31, in Claim 23, delete "includes;" and insert -- includes: --, therefor.

Signed and Sealed this

Twenty-fourth Day of March, 2009

JOHN DOLL  
*Acting Director of the United States Patent and Trademark Office*